United States Patent [19]

Matsuno et al.

[11] Patent Number: 4,603,303
[45] Date of Patent: Jul. 29, 1986

[54] LEVEL COMPENSATION CIRCUIT

[75] Inventors: Keishi Matsuno, Hino; Masafumi Souma, Oume; Atsushi Minegishi, Musashimurayama; Yoshihito Seki, Musashino, all of Japan

[73] Assignee: Iwatsu Electric Co., Ltd., Tokyo, Japan

[21] Appl. No.: 731,399

[22] Filed: May 7, 1985

[30] Foreign Application Priority Data

Jul. 18, 1984 [JP] Japan .................... 59-149146
Jul. 18, 1984 [JP] Japan .................... 59-149147

[51] Int. Cl.$^4$ ............... H03F 21/00; H03K 5/00
[52] U.S. Cl. ..................... 330/11; 328/157; 330/51
[58] Field of Search ............ 330/9, 11, 51; 328/156, 328/157, 20

[56] References Cited

U.S. PATENT DOCUMENTS 2,226,459 12/1940 Bingley .................... 328/157 X
2,716,189 8/1955 Ayres ...................... 328/157 X
3,207,998 9/1965 Corney et al. ............... 330/11

Primary Examiner—James B. Mullins
Attorney, Agent, or Firm—Oblon, Fisher, Spivak, McClelland & Maier

[57] ABSTRACT

In an amplifier including an AC amplifier, its operation level shifts according to input waveforms. When a positive input signal is, for example, inputted, the circuit feeds out a synthesized signal to the amplifier in which signal a positive and negative portions are symmetry and have a time difference. The circuit compensates an operating level of the amplifier so that it amplifies a small signal to keep always a zero level of the signal being constant in spite of various signal waveforms and amplitudes whereby a linearity of the amplifier is improved and fluctuations of a dynamic range thereof are eliminated.

12 Claims, 12 Drawing Figures

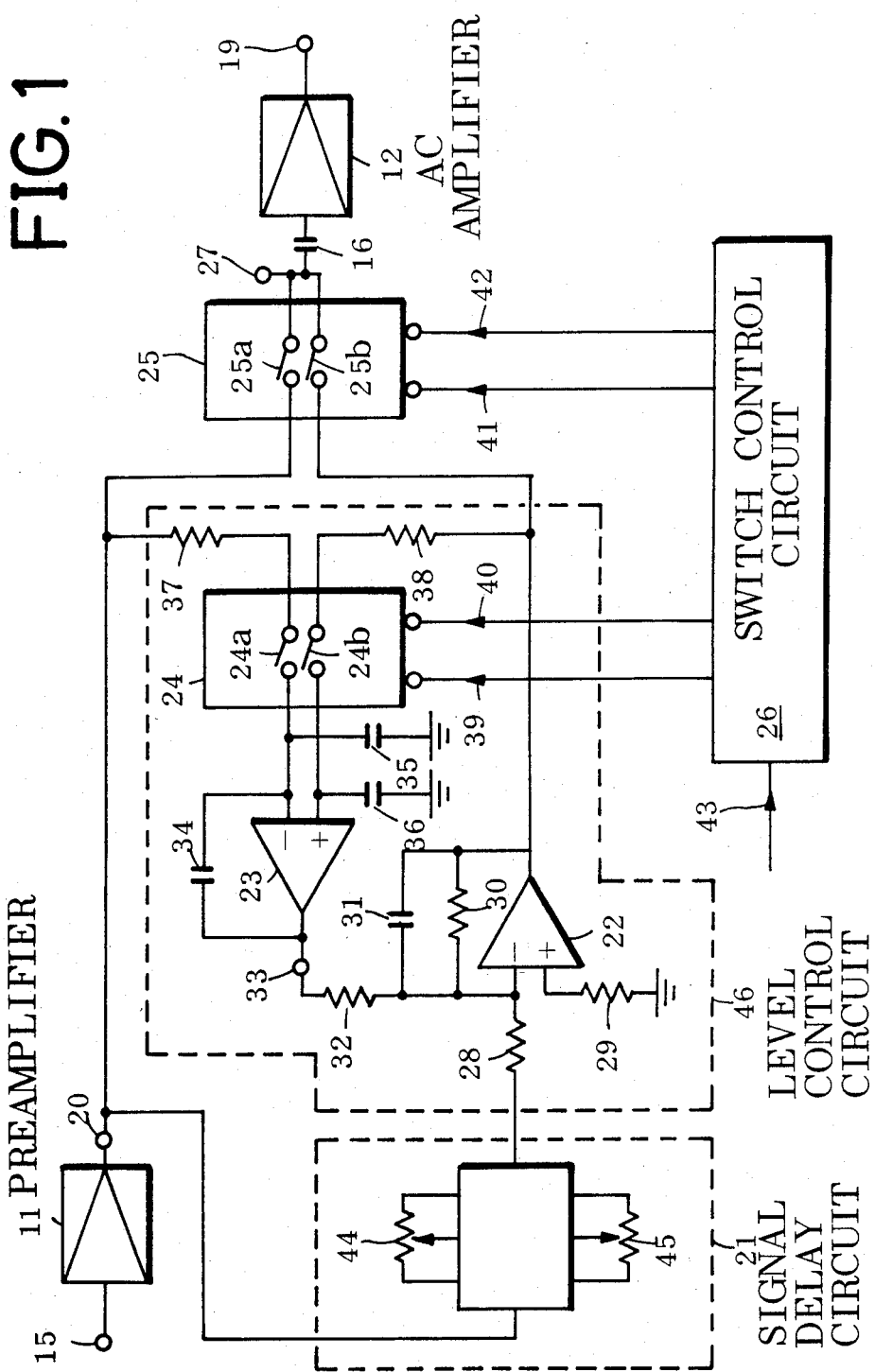

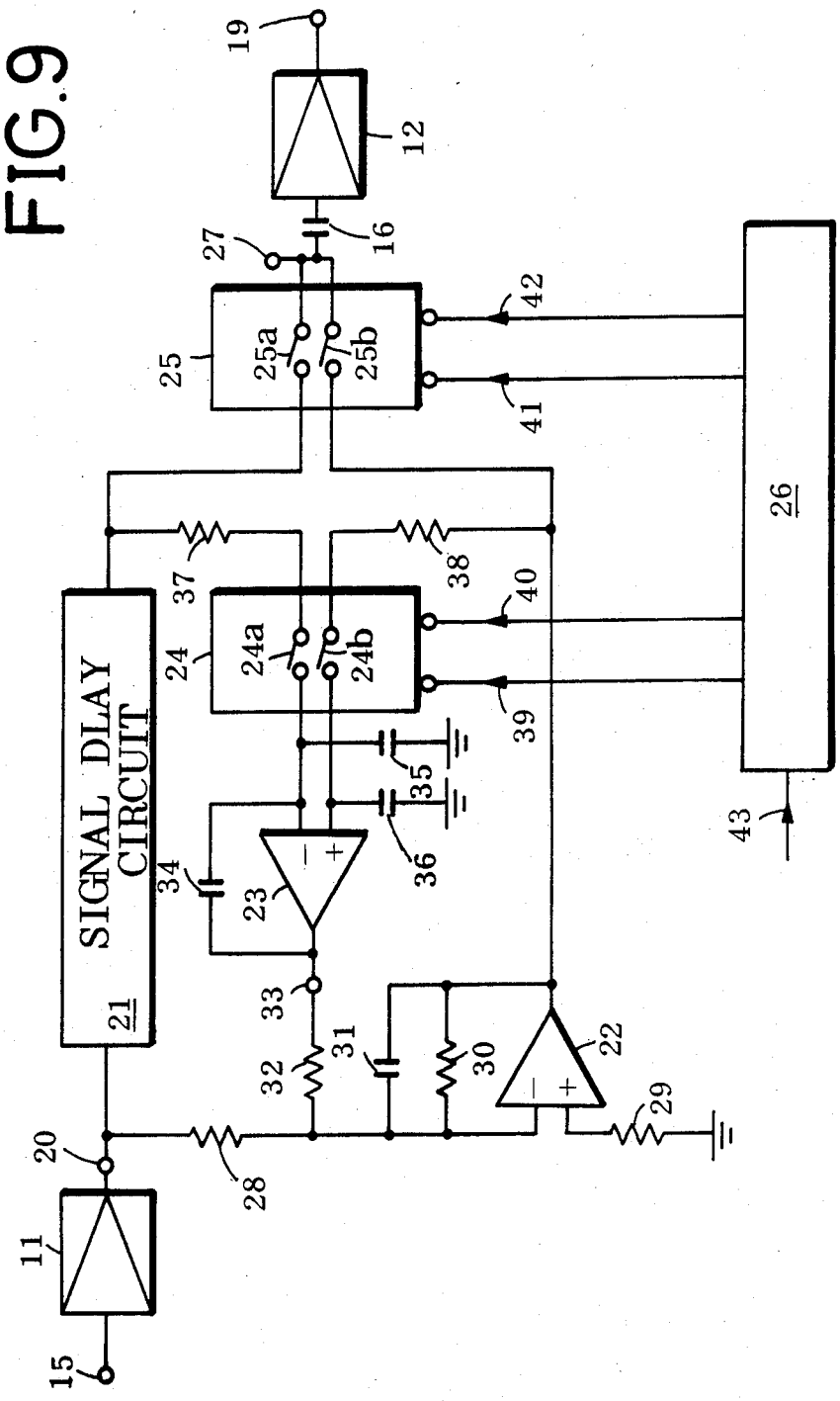

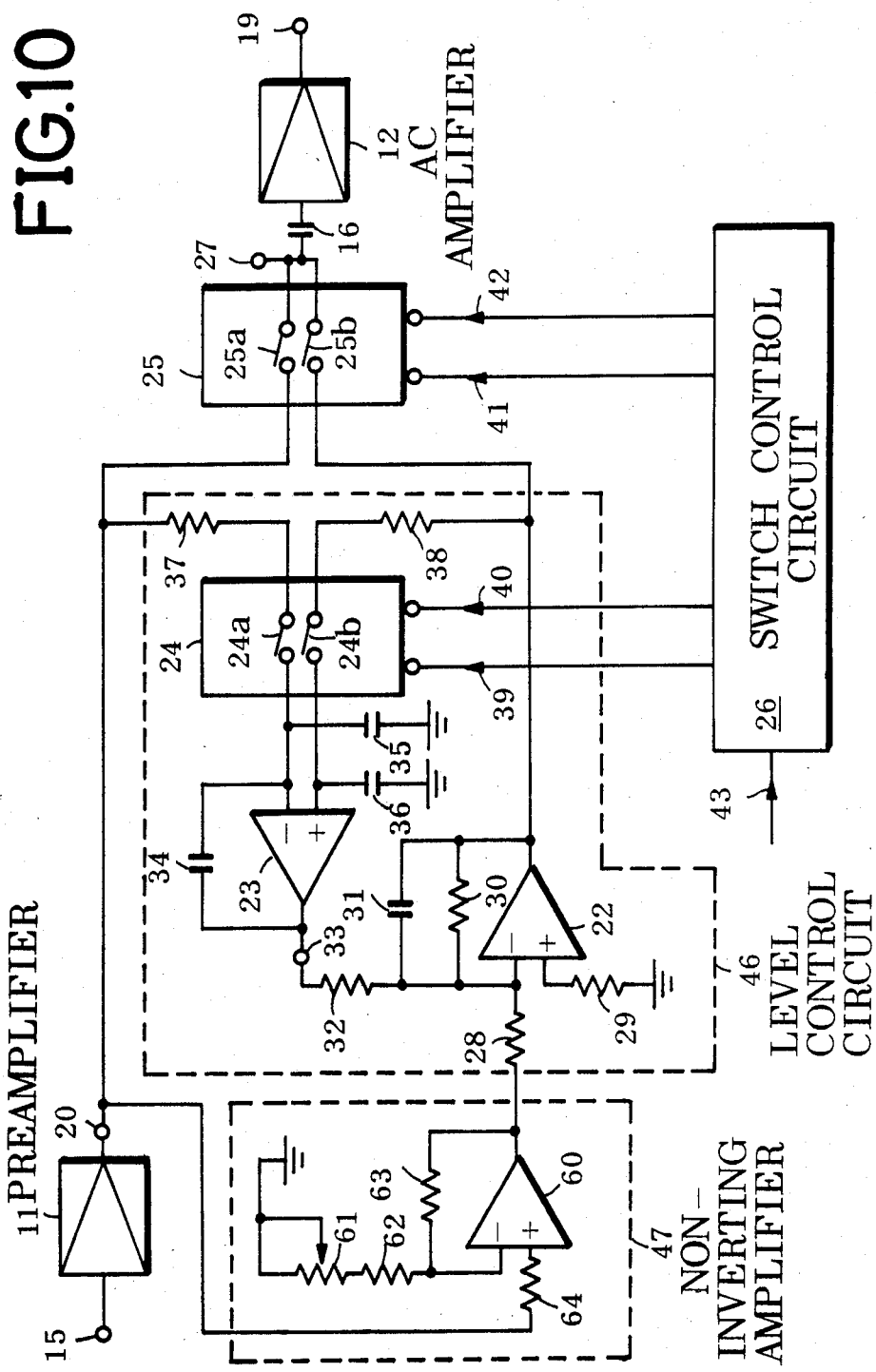

LEVEL COMPENSATION CIRCUIT

BACKGROUND OF THE INVENTION

This invention relates generally to an operating level compensation circuit for compensating an operating level of a high gain amplifier to amplify a very small signal, for instance, a small electrical signal converted from a very small optical signal, and more particularly to a circuit for compensating an operating level of an amplifier including an alternative current amplifier (AC amplifier) which amplifies such a small signal, to keep always a zero level of the signal being constant in spite of various signal waveforms and amplitudes in order to improve a linearity of the amplifier and to suppress fluctuations of a dynamic range of the amplifier.

Recently, top engineerings such as optical fiber communication and so forth have been remarkably developed by supporting of high speed semiconductor technique. In such engineering fields, a wide bandwidth, low noise and high gain amplifier has been more required and it has been important problem to develop the high performance amplifier.

The optical signal has been converted to the electrical signal to be amplified, wherein the high gain amplifier has been required, because the signal has generally been very small. It has been better in not only a performance but a cost to employ the AC amplifier having an enough low cut off frequency than to use cascaded direct current amplifiers (DC amplifiers) including an unavoidable inherent problem of DC drift.

In the optical fiber communication and so forth, the AC amplifier, which has had no problem of the drift and is operatable with a single power supply, miniaturizable and minimizable in power consumption, has been used, because it has not been needed to employ DC amplifiers.

However, in an optical signal measurement and so forth, for instance, in an optical time domain reflectometer (OTDR), it has sent optical pulses from a terminal of a fiber, has amplified and displayed reflective waves from many points of the fiber in order to measure characteristics and to locate disconnections of the fiber, wherein it has been needed to accurately detect a zero level of faint signals of the reflective waves and to use DC amplifiers.

Although, the DC amplifiers including the drift problem and a difficulty of cascaded connections, and requiring plural power supply, have not been always suitable for amplifying the faint signals.

Particularly, in the OTDR, it has been an important subject to get a wide dynamic range amplifier for amplifying the both extremes of the very big amplitude signal from vicinity of a measuring terminal and the faint signal from a distant portion.

In the OTDR, a logarithmic amplifier for amplifying back scattering waves caused by the Rayleigh scattering of the fiber and the reflective waves caused by the Fresnel reflection from discontinuities such as junction points of fibers, a disconnecting point and so forth, has been used in order to get a wide dynamic range and to measure attenuation characteristics of the fiber.

In the logarithmic amplifiers, for reasons to avoid the drift and to get high gain, the AC amplifier has been conventionally employed.

Thereupon, in the OTDR, for the reasons above, the wide band, high gain and wide dynamic range amplifier has been required. However there are disadvantages that such a conventional AC amplifier has been not only expensive but disadvantageous in its characteristics that its dynamic range and accuracy have been seriously influenced by fluctuations of its operation level due to variations of input signal waveforms, for instance, variations of a duty cycle of input pulses.

Especially, in the high gain logarithmic amplifier comprising cascaded logarithmic amplifiers coupled by capacitors between them, the fluctuations of the operation level have caused remarkable deterioration of measurement accuracy due to the logarithmic characteristics, therefor good performances have not been obtainable unless compensations to stabilize the operation level.

SUMMARY OF THE INVENTION

It is an object of the invention to provide a novel, very accurate and inexpensive level compensation circuit for an AC amplifier.

Another object of the invention is to provide a driftless, wide dynamic range and high gain amplifying means.

A further object of the present invention is to provide amplifying means for logarithmically amplifying in OTDR.

Other objects, advantages and features of the present invention will become apparent to those having ordinary skill in the art upon a reading of the following description when taken in conjunction with the accompanying drawings.

BRIEF DESCRIPTION OF THE DRAWINGS

The principle, construction and operation of this invention will be clearly understood from the following detailed description taken in conjunction with the accompanying drawings, in which:

FIG. 1 is a circuit diagram showing an embodiment of this invention;

FIG. 3, and FIG. 5 to FIG. 10 are circuit diagrams showing other embodiments of this invention;

DESCRIPTION OF THE PREFERRED EMBODIMENTS

Figure 2A:
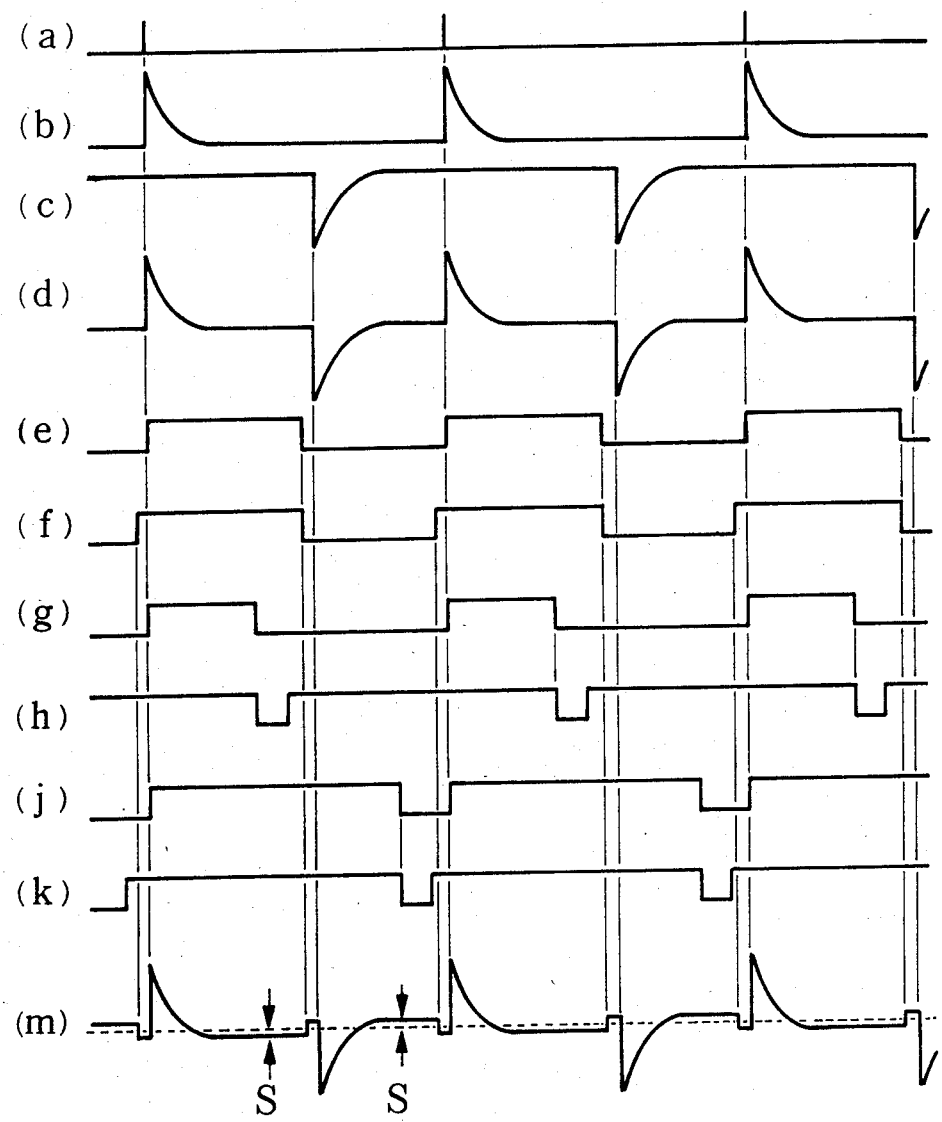
FIGS. 2A and 2B show waveforms for explaining the operation of the circuit diagram of FIG. 1.

With reference to FIG. 1 showing an embodiment of the present invention, reference numeral 11 indicates a preamplifier having an input terminal 15 and an output terminal 20; 12 identifies an AC amplifier connected to the output terminal 20 through switch means 25 including high speed semiconductor analog switches 25a and 25b and a capacitor 16; 19 denotes an output terminal of the AC amplifier 12; 21 indicates a signal delay circuit including an analog delay device such as a bucket brigade device (BBD) or a charge coupled device (CCD) wherein 44 and 45 show variable resistors for adjusting gain and a signal level; 46 refers to a level control circuit which includes, operational amplifier 22 being an inverting amplifier, resistors 28 and 30 for setting a gain of the operational amplifier 22, a resistor 29 for biassing, a capacitor 31 for stabilizing the operational amplifier 22 which has an amplification limited in high frequency to keep it from oscillating, switch means 24 consisting of high speed semiconductor analog switches 24a and 24b respectively connected with the output terminal 20 via a resistor 37 and the output of the operation amplifier 22 via a resistor 38 wherein the resistor 37 has an impedance to keep the signal of the output terminal 20 from being influenced in a high frequency region and to transmit a low frequency region, an operational amplifier 23 having high impedance FET inputs, a large open loop gain and a small drift of an offset voltage, a capacitor 34 for stabilizing the operation of the operational amplifier 23 which has an amplification limited in high frequency to keep it from oscillating, capacitors 35 and 36 respectively for holding signals sampled by the switch means 24 and being connected with the inputs of the operational amplifier 23, and a resistor 32 for connecting an output of the operational amplifier 23 with an input of the operational amplifier 22 via an output terminal 33; 27 indicates an output terminal of the level compensation circuit of this invention being located at a connected point of the switch means 25 and the coupling capacitor 16; and 26 shows a switch control circuit for generating control signals to control the switch means 24 and the switch means 25 through signal lines 39 to 42.

Figure 2B:
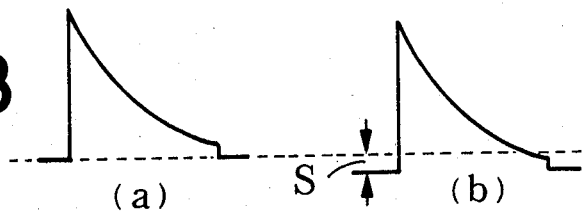

FIG. 2A and FIG. 2B show explanatorily waveform diagrams of the operation of the circuit shown in FIG. 1 according to this invention.

A clock (a) for a timing standard of the circuit operation is shown in FIG. 2A. When a laser diode not shown is, for example, driven synchronizing with the clock (a), the preamplifier 11 amplifies an electrical signal converted from back scattering optical waves of a fiber under test and sends out the amplified signal (b) shown in FIG. 2 to the output terminal 20. The signal at the output terminal 20 is delayed a predetermined period in the signal delay circuit 21, adjusted in an amplitude and a level thereof, and fed to an inverting input terminal of the operational amplifier 22 via the resistor 28 to be amplified, whereby a signal (c) shown in FIG. 2A, which is delayed from the signal (b) and has a reversed polarity, is obtained at the output thereof.

The other side, the switch control circuit 26 is provided the clock (a) via a signal line 43, whereby a monostable multivibrator included therein is triggered to generate a signal (e) which consists of positive rectangular pulses as shown in FIG. 2A and further another monostable multivibrator included therein is triggered by a traling edge of the signal (e) to feed out a signal (f) which consists of negative rectangular pulses as shown in FIG. 2A.

Similarly, a signal (g) and a signal (h) in FIG. 2A are obtained upon receipt of the clock (a) by other two monostable multivibrators included in the switch control circuit 26.

And further, similarly, a signal (j) and a signal (k) in FIG. 2A are obtained by other two monostable multivibrators included therein.

The clock (a), the signals (h), (k), (f) and a signal reversed from the signal (f) are respectively fed to the signal lines 43, 39, 40, 42, and 41, wherein the reversed signal is obtained by a Q output of the monostable multivibrator to generate the signal (f) of a $\overline{Q}$ output.

When a level of the signal (b) reduces enough in amplitude, the analog switch 24a becomes switched on during a low level of the signal (h), whereby the level (the zero level) of the signal (b) is memorized on the memory capacitor 35. Similarly, when a level of the signal (c) reduces enough in amplitude, the analog switch 24b becomes switched on during a low level of the signal (k), whereby the level of the signal (c) is memorized on the memory capacitor 36.

If there is a difference (an error signal) between the levels memorized on the memory capacitors 35 and 36, the error signal being amplified is obtained at the output terminal 33 of the operation amplifier 23 which operates as a differential amplifier for detecting the error signal. The error signal is fed to the inverting input terminal of the operational amplifier 22 via the resistor 32 and fed back to the memory capacitor 36 via the resistor 38 and the alalog switch 24b, whereby the level memorized on the memory capacitor 36 becomes equal to the zero level memorized on the memory capacitor 35. Namely, the level control circuit 46 including a negative feedback loop operates to control the level.

Then, the analog switch 25a is switched on during a high level of the signal (f) and the analog switch 25b is switched on during a low level of the signal (f), whereby a signal (d) synthesized from the signal (b) and the signal (c) is obtained at the output terminal 27. Namely, the switch means 25 operates as a circuit for synthesizing signals.

Because the signal (d) of the output terminal 27 is synthesized from the signals (b) and (c) which have the same zero level, upper and lower areas of the zero level in the signal (d) are equal, therefore the signal (d) is accurately amplifiable in the AC amplifier 12 which is coupled with the coupling capacitor 16 without causing a level shift.

If the negative feedback loop is not employed, a signal (m) shown in FIG. 2A is obtained at the output terminal 27, wherein a zero level shift indicated with S is caused, even if upper and lower areas of the zero level are equal as shown as the signal (m) of FIG. 2A.

If a signal (a) shown in FIG. 2B at the output terminal 20 is fed to the AC amplifier 12 through only the coupling capacitor 16 without the operation of the signal delay circuit 21 and the level control circuit 46, a signal at an input of the AC amplifier 12 behind the coupling capacitor 16 is caused a zero level shift indicated with S as shown in FIG. 2B(b).

In this embodiment, a portion of the signal (d) corresponding to the signal (b) is only an object for being observed. Instead of the signal (f), the signal (e) is avairable, wherein it is difficult to observe a leading portion of the signal (b) i.e. a portion of a back scattering signal from a fiber under test adjacent to the OTDR. Using the signal (f), it is available to display the leading portion and hereafter on a cathode ray tube (not shown) of the OTDR. A delay time to display the leading portion i.e. a time difference between a leading edge of the signal (f) and the leading portion of the signal (b) is easily adjustable, whereby it is available to display the leading portion and hereafter on the cathode ray tube.

[MODIFIED EMBODIMENT 1]

It is necessary in FIG. 1 that an amplification capability for detecting the error signal in the negative feedback circuit including the operational amplifier 23 is enough larger than a gain of the AC amplifier 12 connected behind the level compensation circuit in accordance with the invention. Therefore, when a larger gain than a open loop gain (for example, $10^5$ to $10^6$) of a conventional operational amplifier are required, it is desirable to insert an amplifier shown in FIG. 3 between the output terminal 33 of the operational amplifier 23 and the resistor 32 shown in FIG. 1, wherein reference numeral 55 indicates an operational amplifier, 56 and 57 designate resistors for setting a gain, 58 identifies a resistors for biassing and others are same as those in FIG. 1.

Figure 3:
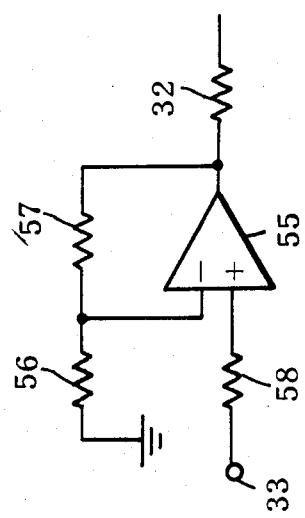

Because the large gain AC amplifier being connected behind the level compensation circuit in accordance with this invention is employed to amplify a faint signal, as abovementioned it is effective to append the amplifier shown in FIG. 3 thereto. In such case, it is important to employ an amplifier having little offset, or to adjust an offset to zero. If the offset is not small enough, the linearity of the waveform being logarithmically displayed on the OTDR is injured, because in the OTDR, the faint signal is conventionally processed by averaging method which is a statistical method to eliminate noise for logarithmically displaying the faint back scattering signal.

[MODIFIED EMBODIMENT 2]

Figure 4:
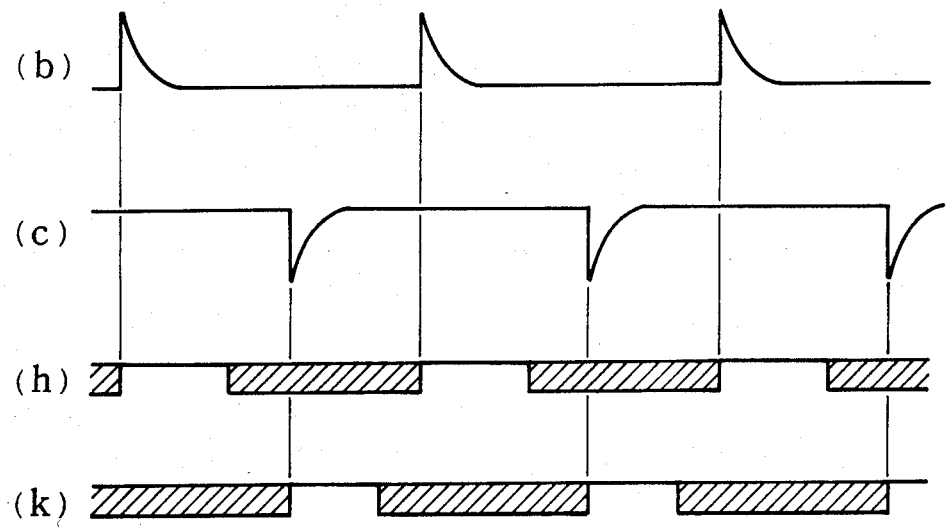
FIG. 4 shows waveforms for a switch control circuit of FIG. 1.

Referring to FIG. 4, there is shown the operation of the switch control circuit 26 of FIG. 1. The signals (b), (c), (h) and (k) of FIG. 4 correspond respectively with (b), (c), (h) and (k) of FIG. 2.

The signals (h) and (k) of FIG. 2 are respectively for being employed to sample the zero levels of the signal (b) and (c) of FIG. 2A, therefore the signals (h) and (k) of FIG. 2A may be turned to the low level during all periods shown by oblique lines of (h) and (k) of FIG. 4. However it is unpreferable that the signals (h) and (k) of FIG. 4 are simultaneously in the low level, because there may be caused unpreferable problems such as oscillation and so forth by both inputs of the operational amplifier 23 being changed simultaneously.

It is believed obvious from the above description that the signal generation timing of the switch control circuit 26 is not limited to those described in FIG. 2A.

[MODIFIED EMBODIMENT 3]

Figure 5:
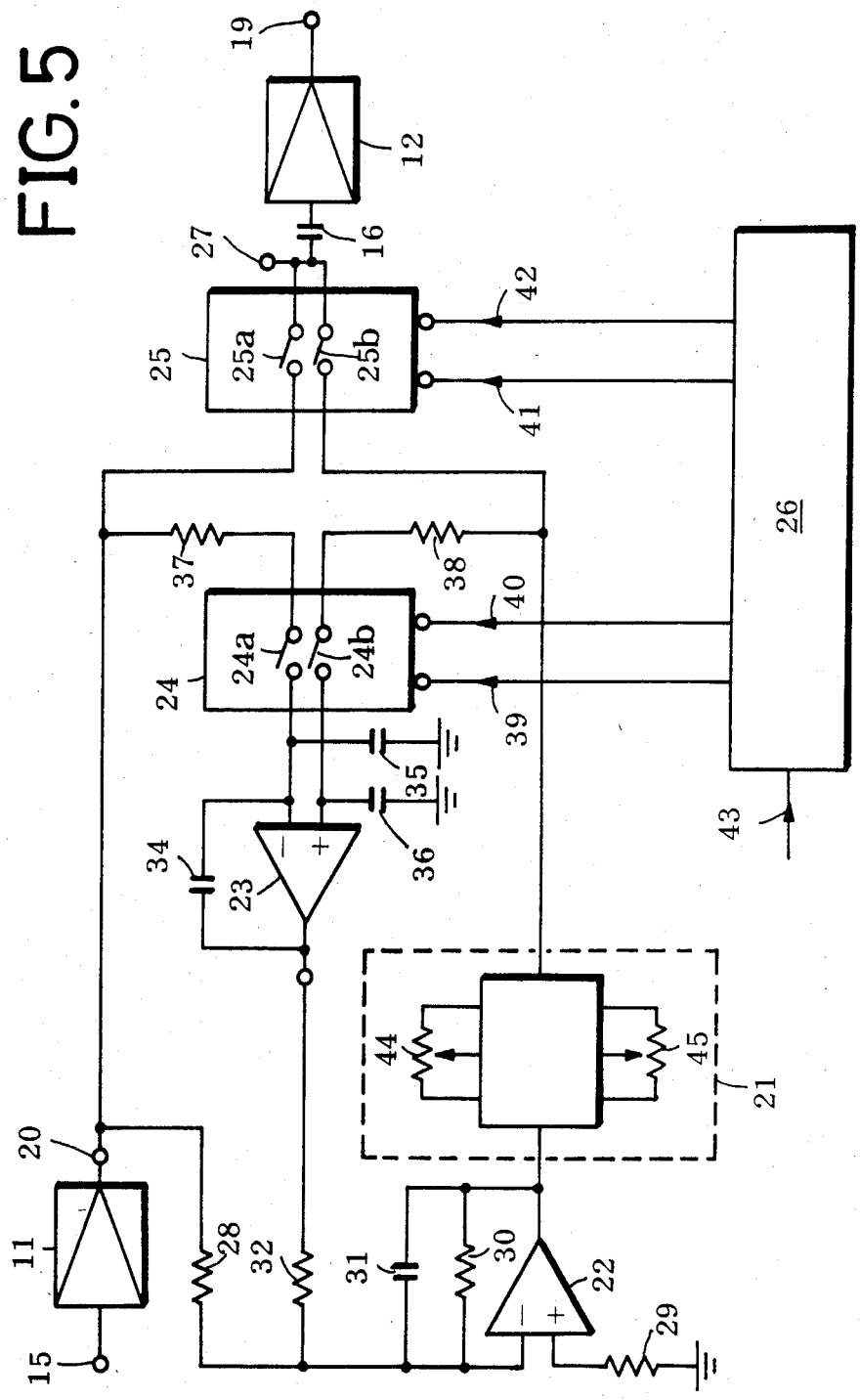

Having described in FIG. 1, it is believed obvious that the connection between the signal delay circuit 21 and the operational amplifier 22 is changeable as shown in FIG. 5, wherein things corresponding to those of FIG. 1 are appended with same reference numerals as shown in FIG. 1, and waveforms of signals of various points in FIG. 5 are same as shown in FIG. 2.

The signal delay circuit 21 is, in FIG. 5, included in the negative feedback loop, therefore although there may be a issue that a response of the negative feedback loop is delayed, if the delay is within a tolerance limit, the same effect as that of FIG. 1 is obtainable.

[MODIFIED EMBODIMENT 4]

Figure 6:
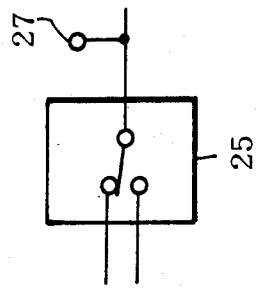

It is believed obvious that the switch 25 of FIG. 1 is changeable to a transfer switch as shown in FIG. 6.

[MODIFIED EMBODIMENT 5]

Figure 8:
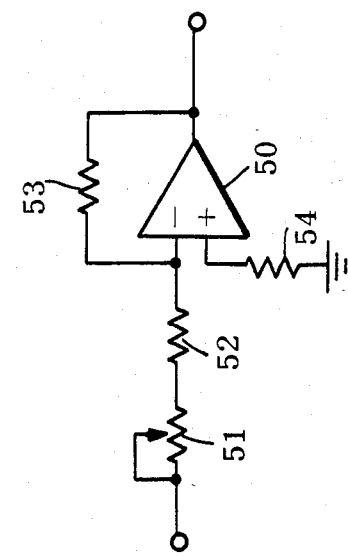
Figure 7:
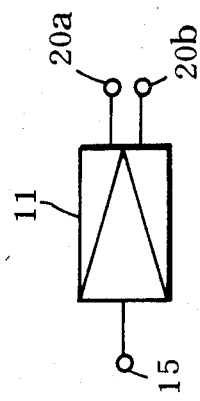

In case an amplifier having an inverted output and a noninverted output as shown in FIG. 7 is employed instead of the preamplifier 11 of FIG. 1, the output 20a of FIG. 7 is connected to the resistor 37 and the analog switch 25a, the output terminal 20b is connected to the signal delay circuit 21 and an inverting amplifier as shown in FIG. 8 is inserted at the output 20a or the output 20b or between the signal delay circuit 21 and the level control circuit 46, whereby it is, having described above, believed obvious that the same effect as that of FIG. 1 is obtainable.

In FIG. 8 reference numeral 50 indicates an operational amplifier and 51 to 54 designate resistors.

[MODIFIED EMBODIMENT 6]

If the signal inputted to the input terminal 15 in FIG. 1 does not include the zero level, the input terminal 15 or the output terminal 20 is grounded for a predetermined period with a switch not shown, or an optical shutter or a optical switch is, in OTDR, set in front of an optical detector to make the optical back scattering signal zero so that the zero level is obtainable.

[MODIFIED EMBODIMENT 7]

Referring to FIG. 9, the signal delay circuit 21 of FIG. 1 is inserted between the output terminal 20, and the resistor 37 and the switch means 25, whereby it is, having described above, believed obvious that the 1st signal is obtained from the output of the signal delay circuit 21, the 2nd signal is obtained from the output of the operational amplifier 22 constructing the inverting amplifier and a signal is synthesized from the 1st and 2nd signals by the switch means 25.

Here, the reference numerals in FIG. 9 are same as those in FIG. 1.

[MODIFIED EMBODIMENT 8]

In FIG. 10, reference numeral 47 indicates a noninverting amplifier; 61 designates a variable resistor; 62 to 64 identify resistors; and others corresponding to those of FIG. 1 are denoted by same reference numerals as shown in FIG. 1.

Figure 11:
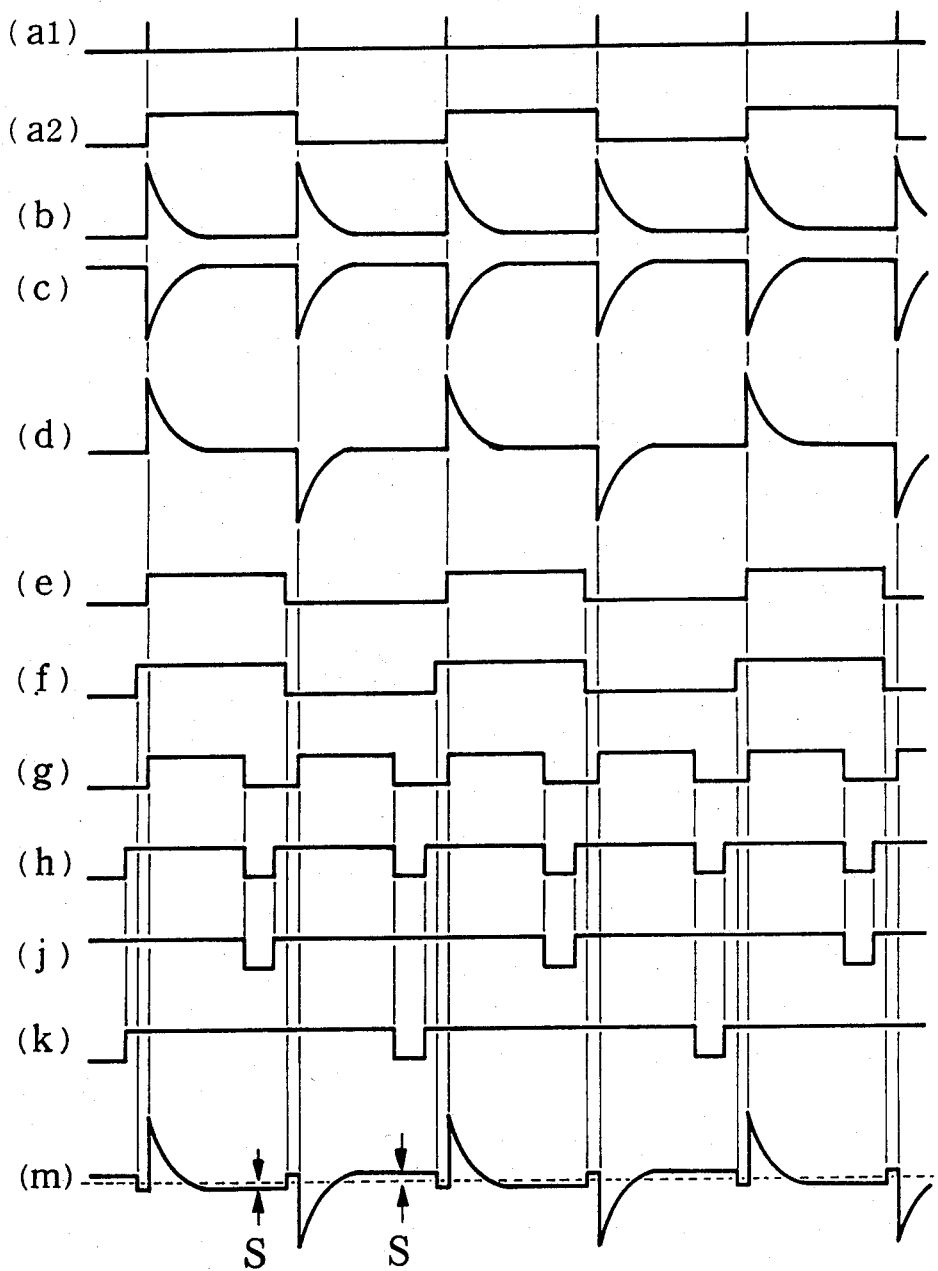
FIG. 11 shows waveforms for explaining the operation of the circuit diagram of FIG. 10.

FIG. 11 shows explanatorily waveform diagrams of the operation of the circuit shown in FIG. 10 according to this invention.

The 1st clock (a1) for timing standard of the circuit operation is shown in FIG. 11. When a laser diode not shown is, for example, driven synchronizing with the 1st clock (a1), the preamplifier 11 amplifies an electrical signal converted from back scattering optical waves of a fiber under test and sends out the amplified signal (b) shown in FIG. 11 to the output terminal 20. The signal at the output terminal 20 is adjusted in amplitude and a level thereof by the noninverting amplifier 47, fed to an inverting input terminal of the operational amplifier 22 via the resistor 28 and amplified, whereby a signal (c) shown in FIG. 11, which has a polality reversed to the signal (b), is obtained at the output of the operational amplifier 22.

The other side, the switch control circuit 26 is provided the 1st clock (a1) via a signal line 43, whereby a bistable multivibrator, for example, included therein is triggered to generate the 2nd clock (a2). The 2nd clock (a2) triggers a monostable multivibrator included in the switch control circuit 26 to generate a signal (e), of which trailing edge triggers another monostable multivibrator included therein to generate a signal (f) which consists of negative rectangular pulses as shown in FIG. 11.

Similarly, a signal (g) and a signal (h) in FIG. 11 are obtained upon receipt of the 1st clock (a1) by other two monostable multivbrators. A signal (j) and a signal (k) are obtained by picking up a pulse alternately every two pulses of the signal (h).

The clock (a1), the signals (j), (k), (f) and a signal reversed from the signal (f) are respectively fed to the signal lines 43, 39, 40, 42 and 41, wherein the reversed signal is obtained by a Q output of the monostable multivibrator to generate the signal (f) of a $\bar{Q}$ output.

When a level of the signal (b) reduces enough in amplitude, the analog switch 24a becomes switched on during a low level of the signal (j), whereby the level (the zero level) of the signal (b) is memorized on the memory capacitor 35. Similarly, when a level of the signal (c) reduces enough in amplitude, the analog switch 24b becomes switched on during a low level of the signal (k), whereby the level of the signal (c) is memorized on the memory capacitor 36.

If there is a difference (an error signal) between the levels memorized on the memory capacitors 35 and 36, the error signal being amplified is obtained at the output terminal 33 of the operational amplifier 23 operating as a differential amplifier for detecting the error signal. The error signal is fed to the inverting input terminal of the operational amplifier 22 via the resistor 32 and fed back to the memory capacitor 36 via the resistor 38 and the analog switch 24b, whereby the level memorized on the memory capacitor 36 becomes equal to the zero level memorized on the memory capacitor 35. Namely, the level control circuit 46 including a negative feedback loop operates as a circuit for controlling the level.

Then, the analog switch 25a is switched on during a high level of the signal (f) and the analog switch 25b is switched on during a low level of the signal (f), whereby a signal (d) synthesized from the signal (b) and the signal (c) is obtained at the output terminal 27. Namely, the switch means 25 operates as a circuit for synthesizing signals.

Because the signal (d) of the output terminal 27 is syntesized from the signal (b) and (c) which have the same zero level, upper and lower areas of the zero level in the signal (d) are equal, therefore the signal (d) is accurately amplifiable in the AC amplifier 12 coupled with the coupling capacitor 16 without causing a level shift.

If the negative feedback loop is not employed, a signal (m) shown in FIG. 11 is obtained at the output terminal 27, wherein a zero level shift indicated with S is caused, even if upper and lower areas of the zero level are equal as shown in the signal (m) of FIG. 11.

In this embodiment, a portion of the signal (d) corresponding to the signal (b) is only a object for being observed. Instead of the signal (f), the signal (e) is available, wherein it is difficult to observe a leading portion of the signal (b) i.e. a portion of a back scattering signal from the fiber under test adjacent to the OTDR. Using the signal (f), it is available to display the leading portion and hereafter on a cathode ray tube (not shown) of the OTDR. A delay time to display the leading portion i.e. a time difference between a leading edge of the signal (f) and the leading portion of the signal (b) is easily adjustable, whereby it is available to display the leading portion and hereafter on the cathode ray tube.

In the operation of the switch control circuit 26 shown in FIG. 10, it is unpreferable that the signals (j) and (k) of FIG. 11 are simultaneously in the low level, because there may be caused unpreferable problems such as oscillation and so forth by both inputs of the operational amplifier 23 being changed simultaneously.

It is believed obvious from the above description that the signal generation timing of the switch control circuit 26 is not limited to those described in FIG. 11.

If the capability of the preamplifier 20 is, in FIG. 10, enough to drive a load, the noninverting amplifier 47 is eliminatable. It is believed obvious from the above description of FIG. 10 that the resistor 28 is displaceable to a variable resistor, provided it is necessary.

In case an amplifier having an inverted output and a noninverted output as shown in FIG. 7 is employed instead of the preamplifier 11 of FIG. 10, the output 20a of FIG. 7 is connected to the resistor 37 and the analog switch 25a, the output terminal 20b is connected to the noninverting amplifier 47 and an inverting amplifier as shown in FIG. 8 is inserted at the output 20a or the output 20b or between the noninverting amplifier 47 and the level control circuit 46, whereby it is, having described above, believed obvious that the same effect as that of FIG. 10 is obtainable.

It is believed obvious that the abovementioned modified embodiments 1, 4, and 6 are available to this embodiment 8, too.

In the above embodiments, in case of using a high gain logarithmic amplifier as the AC amplifier 12, a distinguished effect is expected.

Further, using a linear amplifier as the AC amplifier 12, the same performance as a high gain DC amplifier may be provided, whereupon a driftless high accuracy amplifier is rather obtainable.

Depending on the invention, a stable operation is expected because a zero level of a signal is sampled and the level is compensated by the negative feedback.

The described invention provides the level compensation circuit to make an AC amplifier having a gain grater than 80 dB stably operate.

It is to be understood that the invention is not limited in its application to the details of construction and arrangement of elements illustrated in the accompanying drawings, since the invention is capable of other embodiments and of being practiced or carried out in various ways. Also it is to be understood that the phraseology or terminology employed herein is for the purpose of description and not of limitation.

What is claimed is:

1. A level compensation circuit comprising:
   a preamplifier for amplifying an input signal;
   means for obtaining a first signal from a portion of an output of said preamplifier;
   level control means for obtaining a second signal while the first signal is zero from another portion of the output of said preamplifier which second signal has a reverse polarity to the first signal, substantially the same waveform as that of the first signal, substantially the same amplitude as that of the first signal, a time difference from the first signal, and substantially the same zero level as that of the first signal; and
   switch means for obtaining a synthesized signal having substantially the same zero level as that of the first and second signals by alternately exchanging the first signal and the second signal which synthesized signal is fed to an AC amplifier.

2. A level compensation circuit as claimed in claim 1, wherein said switch means comprises a transfer type switch.

3. A level compensation circuit as claimed in claim 1, wherein the second signal is delayed from the first signal.

4. A level compensation circuit as claimed in claim 3, wherein said level control means comprises:
   signal delay means for delaying an output of said preamplifier to obtain the time difference from the first signal so that the second signal may appear while the first signal is zero;
   a first switch and a first memory capacitor for detecting and memorizing the zero level of the first signal;

an operational amplifier for being fed a signal stored on said first memory capacitor to one input terminal thereof;

an inverting amplifier for feeding out the second signal upon receipt of outputs of said operational amplifier and said signal delay means;

a second switch and a second memory capacitor for detecting and memorizing a zero level of an output of said inverting amplifier; and a negative feedback loop being formed by means of a signal stored on said second capacitor being fed to another input of said operational amplifier.

5. A level compensation circuit as claimed in claim 3, wherein said level control means comprises:

a first switch and a first memory capacitor for detecting and memorizing the zero level of the first signal;

an operational amplifier for being fed a signal stored on said first memory capacitor to one input terminal thereof;

an inverting amplifier for feeding out an output upon receipt of an output of said operational amplifier and the another portion of the output of said preamplifier;

signal delay means for obtaining the second signal by means of delaying the output of said inverting amplifier;

a second switch and a second memory capacitor for detecting and memorizing a zero level of an output of said signal delay means; and a negative feedback loop being formed by means of a signal stored on said second capacitor being fed to another input of said operational amplifier.

6. A level compensation circuit as claimed in claim 1, wherein the first signal is delayed from the second signal by said means for obtaining the first signal.

7. A level compensation circuit as claimed in claim 6, wherein said means for obtaining the first signal from said preamplifier comprises a signal delay means for delaying the portion of the output of said preamplifier, and said level control means comprises:

a first switch and a first memory capacitor for detecting and memorizing the zero level of the first signal;

an operational amplifier for being fed a signal stored on said first memory capacitor to one input terminal thereof;

an inverting amplifier for feeding out the second signal upon receipt of an output of said operational amplifier and the another portion of the output of said preamplifier;

a second switch and a second memory capacitor for detecting and memorizing a zero level of an output of said inverting amplifier; and a negative feedback loop being formed by means of a signal stored on said second capacitor being fed to another input of said operational amplifier.

8. A level compensation circuit as claimed in any of claims 4, 7, and 5, wherein said level control means includes an amplifier for compensating insufficiency of amplification of said operational amplifier.

9. A level compensation circuit comprising:

a preamplifier for amplifying an input signal;

means for obtaining a first signal from a portion of an output of said preamplifier;

level control means for obtaining a second signal from another portion of the output of said preamplifier which second signal has substantially the same amplitude as that of the first signal, a reverse polarity to the first signal, substantially the same waveform as that of the first signal, and substantially the same zero level as a zero level of the first signal; and switch means for obtaining a synthesized signal having substantially the same zero level as that of the first and second signals by alternately exchanging the first signal and the second signal which synthesized signal is fed to an AC amplifier.

10. A level compensation circuit as claimed in claim 9, wherein said switch means comprises a transfer type switch.

11. A level compensation circuit as claimed in claim 9, wherein said level control means comprises:

a first switch and a first memory capacitor for detecting and memorizing the zero level of the first signal;

an operational amplifier for being fed a signal stored and said first memory capacitor to one input terminal thereof;

an inverting amplifier for feeding out the second signal upon receipt of an output of said operational amplifier and a signal from said preamplifier;

a second switch and a second memory capacitor for detecting and memorizing a zero level of an output of said inverting amplifier; and a negative feedback loop being formed by means of a signal stored on said second capacitor being fed to another input of said operational amplifier.

12. A level compensation circuit as claimed in claim 11, wherein said level control means includes an amplifier for compensating insufficiency of amplification of said operational amplifier.

* * * * *